United States Patent
Hong et al.

(10) Patent No.: US 7,816,675 B2
(45) Date of Patent: Oct. 19, 2010

(54) ORGANIC THIN FILM TRANSISTOR COMPRISING GATE ELECTRODE OF NANOCRYSTALLINE CONDUCTIVE CARBON LAYER, FABRICATION METHOD THEREOF, AND ORGANIC SEMICONDUCTOR DEVICE COMPRISING THE SAME

(75) Inventors: Byung You Hong, Gyeonggi-do (KR); Yong Seob Park, Gyeonggi-do (KR); Won Seok Choi, Seoul (KR); Nae Eung Lee, Gyeonggi-do (KR); Young Gug Seol, Gyeongsangbuk-do (KR); Hwa Young Noh, Busan (KR)

(73) Assignee: Sungkyunkwan University Foundation for Corporate Collaboration, Gyeonggi-Do (KR)

( * ) Notice: Subject to any disclaimer, the term of this patent is extended or adjusted under 35 U.S.C. 154(b) by 221 days.

(21) Appl. No.: 11/965,280

(22) Filed: Dec. 27, 2007

(65) Prior Publication Data
    US 2009/0057655 A1    Mar. 5, 2009

(30) Foreign Application Priority Data
    Sep. 3, 2007    (KR) ..................... 10-2007-0089029

(51) Int. Cl.
    *H01L 29/72*    (2006.01)
(52) U.S. Cl. .................. 257/40; 257/288; 257/368; 977/742; 977/832; 977/938
(58) Field of Classification Search ................ 257/40, 257/288, 368; 977/742, 832, 938
    See application file for complete search history.

(56) References Cited

U.S. PATENT DOCUMENTS

| | | | |
|---|---|---|---|
| 7,622,367 B1 * | 11/2009 | Nuzzo et al. | 438/472 |
| 2006/0145146 A1 * | 7/2006 | Suh et al. | 257/40 |
| 2007/0111031 A1 * | 5/2007 | Isberg et al. | 428/698 |

* cited by examiner

*Primary Examiner*—Edward Wojciechowicz
(74) *Attorney, Agent, or Firm*—Rabin & Berdo, P.C.

(57) ABSTRACT

Provided are an organic thin film transistor (OTFT) and a fabrication method thereof, an organic semiconductor device having the OTFT, and a flexible display device having the OTFT. The OTFT includes a substrate, a gate electrode, an insulating layer, an active layer, and a source/drain electrode. The gate electrode may be made of a nanocrystalline carbon layer.

7 Claims, 7 Drawing Sheets

ORGANIC THIN FILM TRANSISTOR COMPRISING GATE ELECTRODE OF NANOCRYSTALLINE CONDUCTIVE CARBON LAYER, FABRICATION METHOD THEREOF, AND ORGANIC SEMICONDUCTOR DEVICE COMPRISING THE SAME

The present application claims priority under 35 U.S.C. 119 to Korean Patent Application No. 10-2007-89029 (filed on Sep. 3, 2007), which is hereby incorporated by reference in its entirety.

TECHNICAL FIELD

Embodiments relate to an organic thin film transistor (OTFT) and a fabrication method thereof, an organic semiconductor device having the OTFT, and a flexible display device having the OTFT.

More particularly, embodiments relate to an organic thin film transistor (OTFT) and a fabrication method thereof for improving the physical and electrical characteristics of a gate electrode by forming the gate electrode between a flexible substrate, such as glass, polyimide, and polyethersulfone (PES), and an organic dielectric layer through depositing a nano crystalline conductive carbon thin film.

BACKGROUND

Researches have been made on the characteristics of an organic matter since the late 1970's and technologies for making organic matters to have conductivity through doping were introduced. Accordingly, many organic matters having conductivity were introduced and such organic matters were used to develop various devices, such as organic solar batteries, organic emitting light displays, organic thin film transistors, and capacitor elements. Also, the development of polyacetylene, conjugated organic polymer, makes it possible to easily form organic semiconductors in fibers or in a film, and the organic semiconductors have many advantages, such as flexibility, conductivity, and a low manufacturing cost. Due to such characteristics of the organic semiconductor, the organic semiconductors have been adapted to various application fields, for example, a functional electronic devices and optical devices. Particularly, an organic thin film transistor (OTFT) has been used as a core part in various application fields, such as, a rollable display, a smart card, and a radio frequency (RF) tag.

The performance of an organic thin film depends on the crystallinity of an organic active thin film. The crystallinity depends on a growing process of a thin film and the surface condition of a gate insulating layer where an organic thin film is grown. According to the analysis of the organic devices, the adhesive force and the interfacial property, such as crystallinity and interfacial illuminance, between a substrate and an electrode and between an electrode and an organic insulating layer, and electric characteristics, such as interfacial properties, have been recognized as major factors to be improved.

The gate electrode of an organic thin film transistor according to the related art was made of metal. Such a metal electrode had high reflectivity and was weak physically. Therefore, it is necessary to develop a new device as a gate electrode instead of the metal electrode.

SUMMARY

Embodiments have been proposed in order to provide a method for manufacturing an organic thin film transistor by depositing a nanocrystalline conductive carbon layer as a gate electrode of an organic thin film transistor for improving the manufacturing process of an organic thin film transistor (OTFT), enhancing the characteristics of an element, and improving the product thereof.

Embodiments have been proposed in order to provide an organic thin film transistor having a conductive carbon layer as a gate electrode and a method of applying the same.

In order to solve the above problems, embodiments provide an organic thin film transistor including: a substrate; a gate electrode; an insulating layer; an active layer; and a source/drain electrode, wherein the gate electrode is made of a nanocrystalline carbon layer.

Embodiments also provide a method for fabricating an organic thin film transistor having a substrate, a gate electrode, an insulating layer, an active layer, and a source/drain electrode, including: preparing a flexible substrate; depositing a nanocrystalline carbon layer on the substrate as a gate electrode; forming an organic insulating layer on the substrate with the gate electrode deposited; forming an organic active layer on the organic insulating layer; and forming a source/drain electrode on the organic active layer.

In the organic thin film transistor and a method for fabricating the same according to the embodiments, a gate electrode of an organic thin film transistor having an organic insulating layer and an organic active layer is formed by depositing a nanocrystalline conductive carbon layer. Therefore, the gate electrode has electric conductivity as well as physical characteristics of a low friction coefficient, a smooth surface, corrosion resistance, and oxidation resistance.

Therefore, the gate electrode of the organic thin film transistor according to the embodiments has the conductivity similar to a metal electrode and the adhesive force of the gate electrode and a substrate increases. The gate electrode is mainly made of carbon. That is, the adhesive force between the gate electrode and an organic material formed thereon increases because the gate electrode is made of material identical to that of an organic material formed on the gate electrode. Therefore, the life of the organic thin film transistor (OTFT) according to the embodiments can be extended due to the unique physical characteristics of carbon, and a cost for manufacturing an electronic device can be reduced if a conductive carbon metal is used comparing that for manufacturing an electronic device having a metal electrode.

According to the embodiments, the nanocrystalline carbon layer improves the physical characteristics of the organic thin film transistor, such as adhesive force between a substrate and an organic insulating layer and a smooth surface related to the growing of an organic active layer. The electric characteristics of an organic electronic device are improved by improving the characteristics of an organic insulating layer and an organic active layer formed on the electrode layer based on the improved physical characteristics.

DRAWINGS

DESCRIPTION

Hereinafter, embodiments of the present invention will be described in detail with reference to the accompanying drawings.

An organic thin film transistor according to embodiments includes a substrate, a gate electrode, an insulating layer, an active layer, and a source/drain electrode. The gate electrode is made of a nanocrystalline carbon layer.

The substrate may be made of silicon or glass, and a flexible substrate may be used as the substrate. Especially, the substrate may be made of one selected from the group consisting of silicon (Si), glass, polyimide (PI), polyether sulfone (PES), polyethylene naphthalate (PEN), polyethylene terephthalate (PET), polycarbonate (PC), polyarylate (PAR), and polynorbornene (PNB).

The insulating layer may be made of one of polyvinylphenol and polyvinylalchole, and the active layer may be made of one of pentacene and P3HT.

The nanocrystalline carbon layer may be made of approximately 2 nm to 5 nm sized carbon clusters and has electric resistivity smaller than approximately $2 \times 10^{-4}$ $\Omega$cm, and the nanocrystalline carbon layer may have a surface roughness smaller than 0.3 nm and a friction coefficient smaller than 0.1.

According to embodiments, a method for fabricating an organic thin film transistor having a substrate, a gate electrode, an insulating layer, an active layer, and a source/drain electrode, includes preparing a flexible substrate; depositing a nanocrystalline carbon layer on the substrate as a gate electrode; forming an organic insulating layer on the substrate with the gate electrode deposited; forming an organic active layer on the organic insulating layer; and forming a source/drain electrode on the organic active layer.

The nanocrystalline carbon layer may be deposited using a typical thin film depositing method. Particularly, an imbalanced magnetron sputtering method may be used.

An organic transistor according to embodiments may be used as an organic semiconductor device. Particularly, the organic transistor may be used as a flexible display device. Since it is expected that nanocrystalline carbon material will be used as alternative for silicon, the organic thin film transistor using the nanocrystalline carbon material as a gate electrode can be used as a flexible display device.

Figure 1:
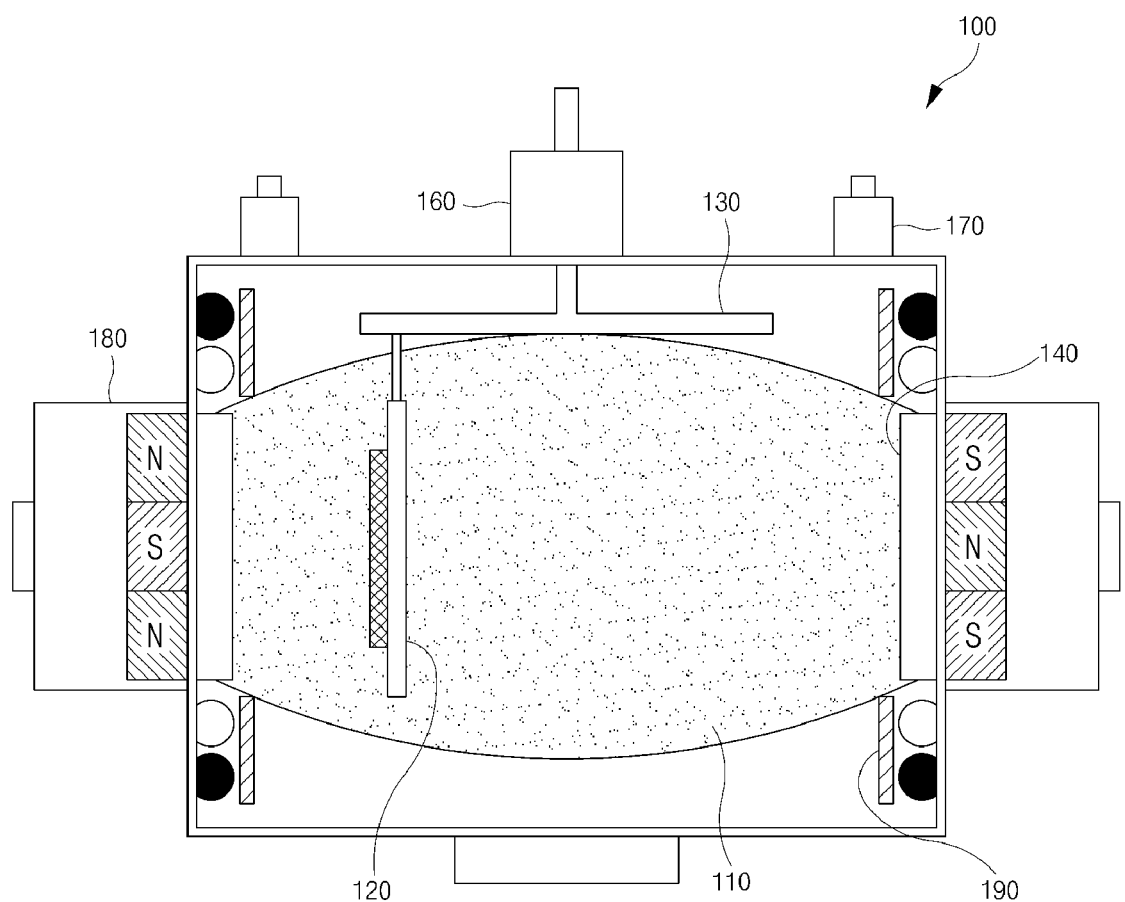
FIG. 1 is a schematic diagram illustrating a thin film depositing apparatus for forming a gate electrode of an organic thin film transistor in accordance with embodiments.

FIG. 1 is a schematic diagram illustrating a thin film depositing apparatus for forming a gate electrode of an organic thin film transistor in accordance with embodiments.

The thin film depositing apparatus of FIG. 1 is an apparatus for depositing a nanocrystalline carbon thin film based on an unbalanced magnetron sputtering method. The thin film depositing apparatus forms a gate electrode by depositing a nanocrystalline carbon layer on a substrate disposed on a substrate support member using an unbalanced magnetron sputtering method.

The thin film depositing apparatus 100 includes a chamber 110 providing a space for forming plasma, a substrate support member 120 disposed in the chamber 110 for mounting a substrate thereon, a jig 130 and a DC power supply 160 for applying DC bias voltage to the substrate support member, two magnetrons 180 for stably forming plasma in the chamber, two graphite targets 140 disposed at each of the magnetrons, a gas supply unit 170 for supplying argon (Ar) or helium (He) gas as a sputtering gas into the chamber, and a cooling line 190.

In order to form a gate electrode using a nano-crystalline carbon layer through the thin film depositing apparatus 100, a substrate is disposed at the substrate support member 120 in the chamber. The substrate may be made of one selected from the group consisting of silicon (Si), glass, polyimide (PI), polyether sulfone (PES), polyethylene naphthalate (PEN), polyethylene terephthalate (PET), polycarbonate (PC), polyarylate (PAR), and polynorbornene (PNB). Then, impurities are removed from the chamber by sustaining the initial vacuum state of the chamber at about $10^{-6}$ Torr for outgassing. The vacuum state of the chamber is sustained at the depositing pressure of $3 \times 10^{-3}$ Torr in a process of activating plasma by inserting an argon gas (Ar) or a helium gas (He) through the gas supply unit 170, and the inside temperature of the chamber is controlled through the cooling line 190 at about 50° to 80°. Here, the inside temperature is a depositing temperature for depositing a nano crystalline conductive carbon thin film. The temperature range may be set in consideration of heat generated during sputtering. Preferably, the inside temperature is sustained at about 55°. If the inside temperature of the chamber is lower than 50°, the inside of the chamber becomes moisturized because the cooling rate becomes greater than heat generated from plasma. It may become a factor to increase stress by reducing the adhesive force between a thin film and a substrate. If the inside temperature of the chamber is higher than 80°, or if the inside temperature of chamber is higher than 100° for a silicon substrate, the silicon substrate may not be distorted or damaged. However, if the inside temperature of a chamber increases higher than 100° for a flexible substrate, the flexible substrate may be distorted or damaged Finally, the physical and electrical characteristics thereof may be influenced. Under this condition, the DC bias power supply 160 applies a DC bias voltage of about −100V to −300V and a nanocrystalline carbon layer is deposited on the substrate using about 2 nm to 5 nm sized carbon cluster. If the applied DC bias voltage is lower than about −100V, the carbon layer becomes an amorphous state, which is formed of various carbon bonds. In the amorphous state, it is difficult to form a nano crystalline carbon layer. It may reduce the electric characteristics of a carbon layer. If the applied DC bias voltage is higher that −300V, great impact is applied to a corresponding part thereof and it damages the corresponding part. Therefore, the roughness of surface of the carbon layer increases. That is, the carbon layer becomes internally carbonized and the hardness of the thin film is reduced. Also, a carbon atom density changes and the physical characteristics of a thin film become weaker. Although the conductivity is sustained, the physical characteristics deteriorate because the carbon layer structurally changes. Therefore, the thin film may easily come off due to the stress thereof. Here, it is preferable that the nanocrystalline carbon layer is formed to have a thickness of 150±30 nm and to have the resistivity smaller than about $2 \times 10^{-4}$ $\Omega$·cm. Here, if the thickness of the nanocrystalline carbon layer is thicker than about 180 nm, the carbon layer becomes opaque. If the thickness of the nanocrystalline carbon layer is thinner than about 120 nm, the resistivity becomes comparatively greater although the carbon layer may become transparent.

It is also preferable that the surface roughness of the nanocrystalline carbon layer is lower than about 0.3 nm and the friction coefficient is smaller than about 0.1. As the surface roughness becomes lower, the adhesive force between the nanocrystalline carbon layer and the dielectric insulating layer becomes improved due to the uniform surface when the dielectric insulator is composited based on a spin coating method. Furthermore, the low friction coefficient is a result of the nanocrystalline carbon layer deposited according to the embodiment. The low friction coefficient relates to a surface roughness and a density of a thin film made of carbon. Therefore, if the friction coefficient is smaller than 0.1, the same carbon bonds are formed as shown in the cross sectional view of the carbon layer. That is, the physical and electrical characteristics of the nanocrystalline carbon layer depend on the friction coefficient.

Figure 2:
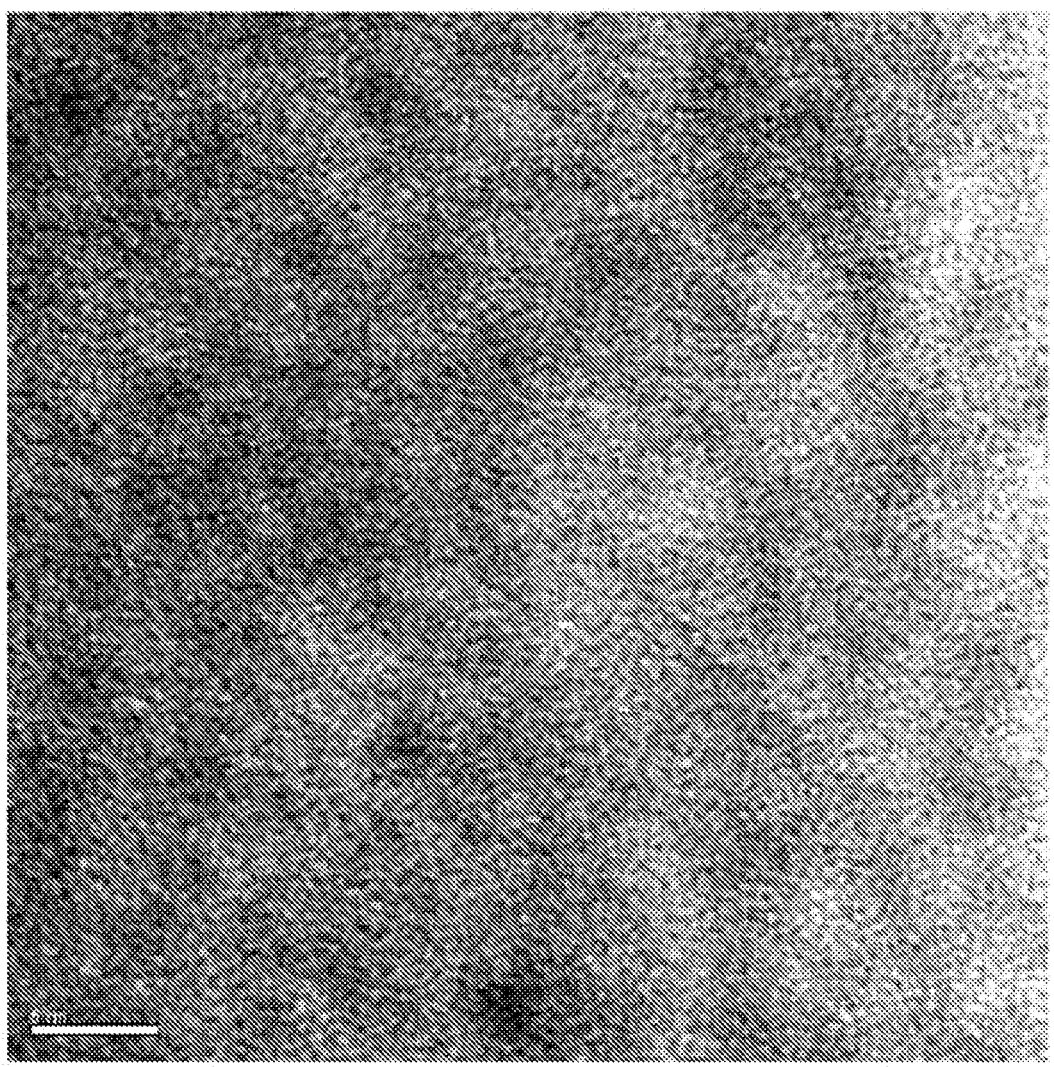
FIG. 2 is a transmission electron microscope (TEM) picture illustrating a fine structural pattern of a nanocrystalline conductive carbon layer in accordance with embodiments.

FIG. 2 is a transmission electron microscope (TEM) picture illustrating a fine structural pattern of a nanocrystalline conductive carbon layer in accordance with embodiments.

As shown in FIG. 2, the TEM picture clearly shows the nanocrystalline carbon layer is made of about 2 to 5 nm sized nano-crystallized particles. Such a set is a carbon cluster formed of sp2 bonds. Such a carbon cluster set improves the physical and electric characteristics of the nanocrystalline carbon layer.

Figure 3:
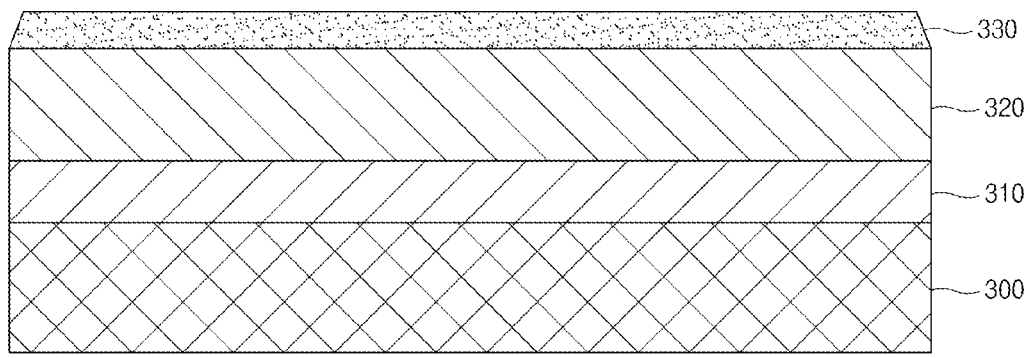
FIG. 3 is a cross-sectional view of an organic thin film transistor in accordance with embodiments.

FIG. 3 is a mimetic cross-sectional view of an organic thin film transistor in accordance with embodiments.

As shown, the organic thin film transistor includes a nanocrystalline conductive carbon layer 310 grown on a substrate made of one of silicon (Si), glass, polyimide (PI), and polyether sulfone (PES), a PVP organic insulating layer 320, and a pentacene organic active layer 330.

Figure 4:
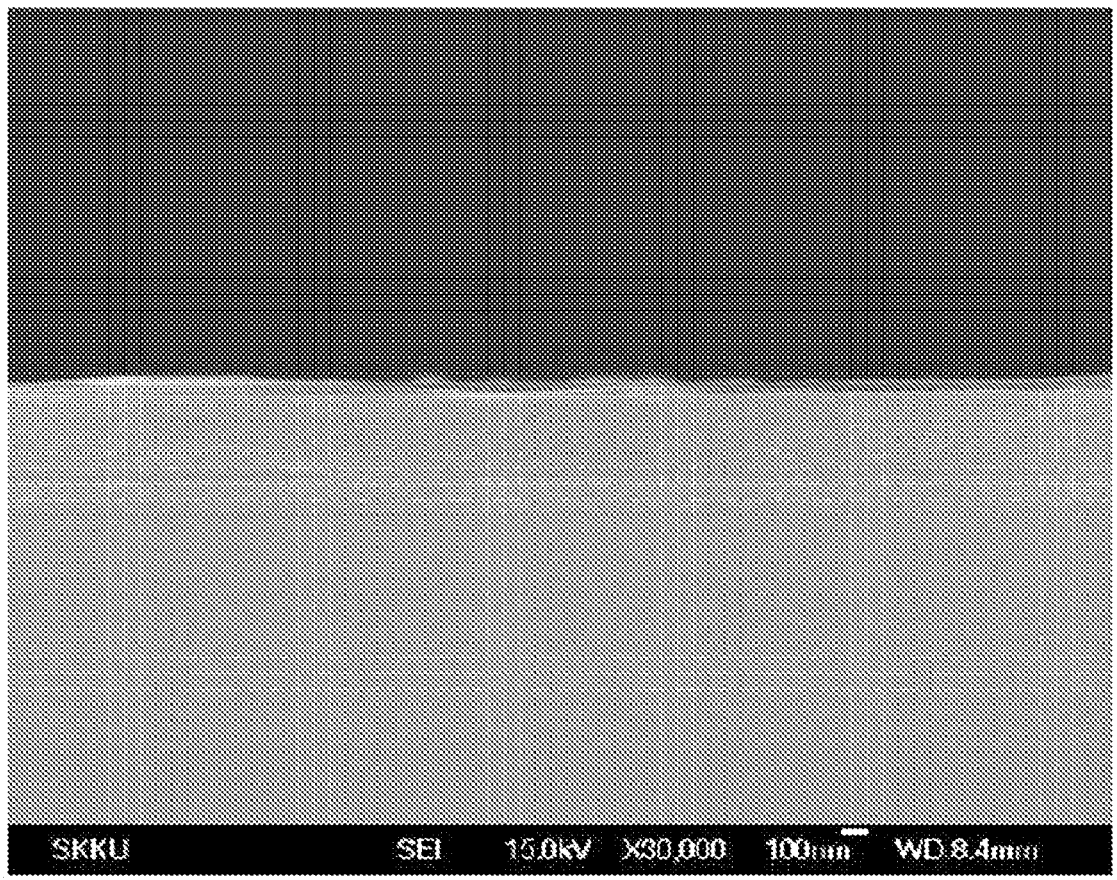
FIG. 4 is a field emission secondary electron microscope (FE-SEM) picture illustrating a cross-sectional view of an organic thin film transistor of FIG. 3.

FIG. 4 is a field emission secondary electron microscope (FE-SEM) picture illustrating a cross-sectional view of an organic thin film transistor of FIG. 3.

The FE-SEM picture of FIG. 4 clearly shows the nanocrystalline carbon layer 310, the PVP organic insulating layer 320, and the pentacene organic active layer 330, which are shown in FIG. 3.

Hereinafter, a method for fabricating an organic thin film transistor according to embodiments will be described in detail.

Embodiment

Figure 5:
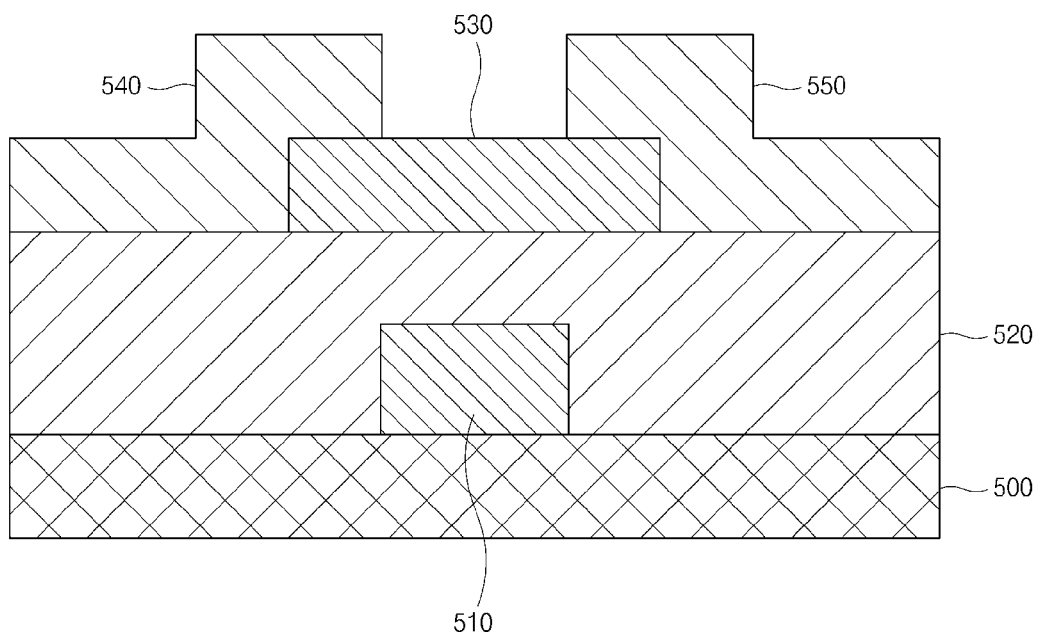
FIG. 5 is a cross-sectional view of an organic thin film transistor (OTFT) formed based on a method for manufacturing an organic thin film transistor in accordance with embodiments.

FIG. 5 illustrates an organic thin film transistor (OTFT) using a gate electrode by forming a nano crystalline conductive carbon thin film on a substrate using an imbalance magnetron sputtering method in a method for fabricating an organic thin film transistor in accordance with embodiments.

As shown in FIG. 5, the organic thin film transistor includes a gate electrode 510 formed using a nanocrystalline carbon thin film on a substrate 500 made of one of silicon (Si), glass, polyimide and polyether sulfone (PES), a PVP organic insulating layer 520 formed on the gate electrode 510 using a spin coating method, a pentacene organic active layer 530 formed on the PVP organic insulating layer 520, and a source electrode 540 and a drain electrode 550 formed on the pentacene organic active layer 530.

The base electrode 510 is formed based on the imbalance magnetron sputtering method in the embodiment as follows. That is, a substrate is disposed on a substrate supply member in a chamber and the impurities are removed from the chamber by sustaining the initial vacuum state of the chamber at about high vacuum of about $10^{-6}$ Torr. Then, a depositing pressure of about $3 \times 10^{-3}$ Torr is formed by inserting about 20 sccm of argon (Ar) gas through the gas supply unit 170 as a sputtering gas in order to activate plasma in the chamber. Then, a nanocrystalline carbon layer is grown on the substrate 500 to have a width of about 1000 μm and a thickness of about 150 nm by applying a DC bias voltage of about −100 V through the DC bias power supply 160 without heat applied.

After forming the gate electrode 510 on the substrate, the PVP organic insulating layer 520 is coated on the substrate 500 at a thickness of about 300 nm using a spin coating method, and the pentacene organic active layer 330 is formed on the PVP organic insulating layer. The pentacene organic active layer 530 is deposited at a thickness of about 100 nm using a thermal evaporator. Then, a source drain 540 and a drain electrode 550 are deposited at about 150 nm using a metal mask having a channel having a length L of about 100 μm and a width of 1500 μm, thereby forming the organic thin film transistor.

Figure 6:
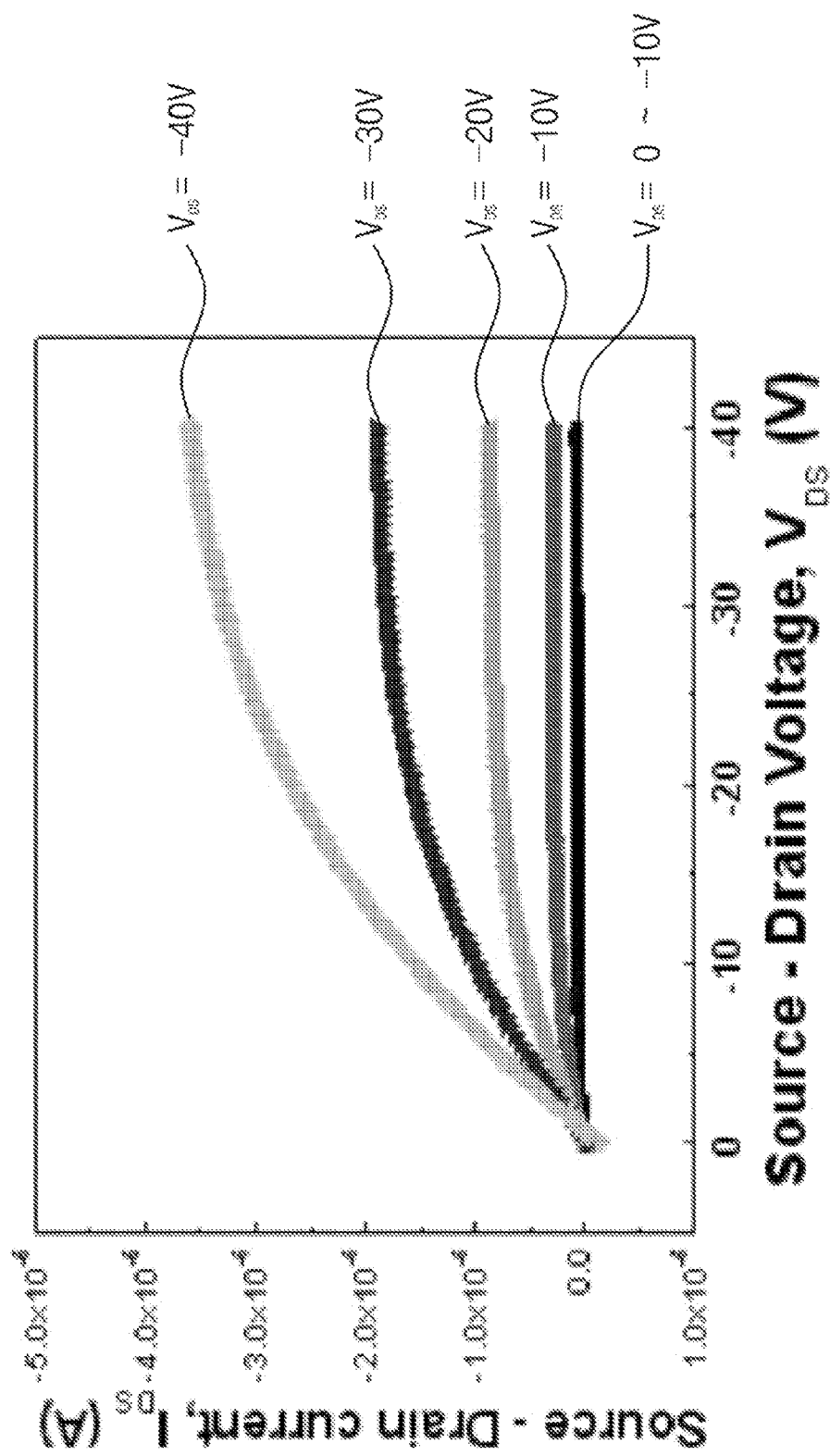
FIG. 6 is a source-drain current and source-drain voltage graph illustrating the electrical characteristics of an organic thin film transistor of FIG. 5.

FIG. 6 illustrates the electric characteristics of the organic thin film transistor including using the nanocrystalline conductive carbon layer 510 grown on the substrate 500, the PVP organic insulating layer 520, the pentacene organic active layer 530, and the source electrode 540 and the drain electrode 550.

Figure 7:
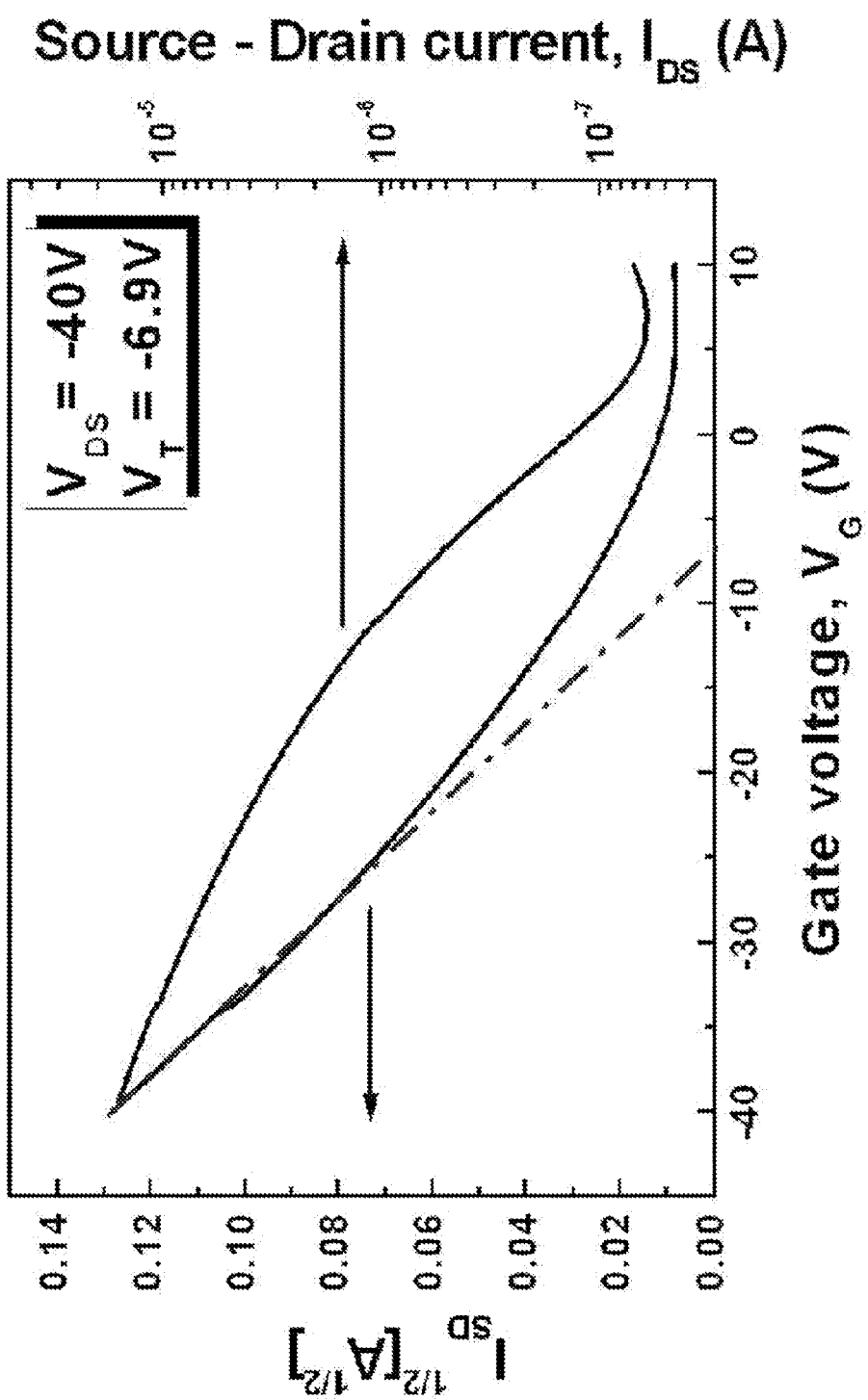
FIG. 7 is a source-drain current and gate voltage graph illustrating the electrical characteristics of an organic thin film transistor manufactured in accordance with embodiments.

FIG. 7 exemplary illustrates the electric characteristics of the organic thin film transistor in accordance with embodiments. The mobility is about 0.58 $cm^2/V \cdot s$, and a Vt value is about −6.9V. Also, an On-Off ratio is about $3 \times 10^2$.

It will be apparent to those skilled in the art that various modifications and variations can be made to embodiments without departing from the spirit or scope of the disclosed embodiments. Thus, it is intended that the present invention covers modifications and variations of this invention provided they come within the scope of the appended claims and their equivalents.

What is claimed is:

1. An organic thin film transistor comprising:
   a substrate;
   a gate electrode;
   an insulating layer;
   an organic active layer; and
   a source/drain electrode,
   wherein the gate electrode is made of a nanocrystalline carbon layer, and does not include metal, and
   wherein the nanocrystalline carbon layer is made of approximately 2 nm to 5 nm sized carbon clusters and has electric resistivity smaller than approximately $2 \times 10^{-4}$ Ωcm and
   wherein the nanocrystalline carbon layer has a surface roughness smaller than 0.3 nm and a friction coefficient smaller than 0.1.

2. The organic thin film transistor of claim 1, wherein the substrate is a flexible substrate.

3. The organic thin film transistor of claim 1, wherein the substrate is made of one selected from the group consisting of silicon (Si), glass;
   polyimide (PI), polyether sulfone (PES), polyethylene naphthalate (PEN), polyethylene terephthalate (PET), polycarbonate (PC), polyarylate (PAR), and polynorbornene (PNB).

4. The organic thin film transistor of claim 1, wherein the insulating layer is made of one of polyvinylphenol and polyvinylalchole.

5. The organic thin film transistor of claim 1, wherein the organic active layer is made of one of pentacene and P3HT.

6. The organic thin film transistor of claim 1, wherein:

the gate electrode is formed on the substrate;

the insulating layer is formed on the substrate, such that a top surface and side surfaces of the gate electrode are covered by the insulating layer and a bottom surface of the gate electrode is flush with a bottom surface of the insulating layer; and the active layer, the source electrode and the drain electrode are formed on the insulating layer.

7. The organic thin film transistor of claim 6, wherein a bottom surface of the active layer, a bottom surface of the source electrode and a bottom surface of the drain electrode are flush with each other.

* * * * *